(12) United States Patent
Zhang et al.

(10) Patent No.: US 11,927,217 B2
(45) Date of Patent: Mar. 12, 2024

(54) METHOD FOR REALIZING MACROSCOPIC SUPER-LUBRICATION BY A MATCHING PAIR OF NANO METAL-COATED STEEL BALLS AND HYDROGEN-CONTAINING CARBON FILMS

(71) Applicant: Lanzhou Institute of Chemical Physics, Chinese Academy of Sciences, Lanzhou (CN)

(72) Inventors: Junyan Zhang, Lanzhou (CN); Qian Jia, Lanzhou (CN); Bin Zhang, Lanzhou (CN); Xingkai Zhang, Lanzhou (CN); Yuanlie Yu, Lanzhou (CN)

(73) Assignee: LANZHOU INSTITUTE OF CHEMICAL PHYSICS, CHINESE ACADEMY OF SCIENCES, Lanzhou (CN)

( * ) Notice: Subject to any disclaimer, the term of this patent is extended or adjusted under 35 U.S.C. 154(b) by 412 days.

(21) Appl. No.: 17/356,583

(22) Filed: Jun. 24, 2021

(65) Prior Publication Data
US 2022/0042547 A1 Feb. 10, 2022

(30) Foreign Application Priority Data
Aug. 4, 2020 (CN) .......................... 202010774380.X

(51) Int. Cl.
F16C 33/32 (2006.01)
C23C 16/27 (2006.01)
(Continued)

(52) U.S. Cl.
CPC ........ F16C 33/6696 (2013.01); C23C 16/276 (2013.01); C23C 28/343 (2013.01);
(Continued)

(58) Field of Classification Search
CPC .. F16C 33/32; F16C 33/6696; F16C 2206/04; F16C 2223/42; F16C 2223/60;
(Continued)

(56) References Cited

U.S. PATENT DOCUMENTS 5,067,826 A * 11/1991 Lemelson ............... F16C 33/32
384/492
8,105,967 B1 * 1/2012 Martin ................ C04B 41/5001
501/97.4
(Continued)

FOREIGN PATENT DOCUMENTS

CN 111455386 A 7/2020
DE 102018211017 A1 * 1/2019 ............. C23C 30/00
(Continued)

OTHER PUBLICATIONS

Office Action for Chinese Patent Application 202010774380.X dated Mar. 1, 2021.
(Continued)

Primary Examiner — Phillip A Johnson
(74) Attorney, Agent, or Firm — FRESH IP PLC; Clifford D. Hyra; Aubrey Y. Chen

(57) ABSTRACT

The present disclosure discloses a method for realizing macroscopic super-lubrication by a matching pair of nano metal-coated steel balls and hydrogen-containing carbon films, which is based on the use of nano metal-coated steel balls and diamond-like films with a hydrogen content of 25-30% as the matching pair. Further, a tribochemical reaction occurs through the catalytic action of nano metal during
(Continued)

the friction process to form a nano graphene transfer film with incommensurate contact at the contact interface to achieve macroscopic super-lubrication.

6 Claims, 3 Drawing Sheets

(51) Int. Cl.
    *C23C 28/00*     (2006.01)
    *C25D 3/12*     (2006.01)
    *C25D 3/48*     (2006.01)
    *C25D 3/50*     (2006.01)
    *F16C 33/66*     (2006.01)

(52) U.S. Cl.
    CPC .............. *C25D 3/12* (2013.01); *C25D 3/48* (2013.01); *C25D 3/50* (2013.01); *F16C 33/32* (2013.01); *F16C 2223/60* (2013.01); *F16C 2223/70* (2013.01)

(58) Field of Classification Search
    CPC . F16C 2223/70; C23C 4/134; C23C 14/0036; C23C 16/276; C23C 28/343; C25D 3/12; C25D 3/48; C25D 3/50
    See application file for complete search history.

(56) References Cited

U.S. PATENT DOCUMENTS

| 2004/0223676 | A1* | 11/2004 | Pope | B22F 7/06 |
| | | | | 384/492 |
| 2013/0209006 | A1* | 8/2013 | Kolev | C23C 16/45546 |
| | | | | 384/129 |
| 2014/0219595 | A1* | 8/2014 | Tsutsui | F16C 33/64 |
| | | | | 384/492 |

FOREIGN PATENT DOCUMENTS

| JP | H06341445 | A | * | 12/1994 | |
| JP | 2000205277 | A | * | 7/2000 | ............. F16C 33/32 |
| JP | 2007155022 | A | * | 6/2007 | ............. F16C 33/32 |
| JP | 2008174653 | A | | 7/2008 | |

OTHER PUBLICATIONS

Heimberg et al, Superlow friction behavior of diamond-like carbon coatings: Time and speed effects, Tribology Section, Code 6176, Naval Research Laboratory, Washington, DC 20375-5342, Applied Physics Letters vol. 78, No. 17, Apr. 23, 2001, https://doi.org/10.1063/1.1366649.

* cited by examiner

METHOD FOR REALIZING MACROSCOPIC SUPER-LUBRICATION BY A MATCHING PAIR OF NANO METAL-COATED STEEL BALLS AND HYDROGEN-CONTAINING CARBON FILMS

CROSS REFERENCE TO RELATED APPLICATION(S)

This patent application claims the benefit and priority of Chinese Patent Application No. 202010774380.X, filed on Aug. 4, 2020, the disclosure of which is incorporated by reference herein in its entirety as part of the present application.

TECHNICAL FIELD

The present disclosure relates to a method for realizing macroscopic super-lubrication by a matching pair of nano metal-coated steel balls and hydrogen-containing carbon films, and belongs to the field of solid super-lubrication and tribology.

BACKGROUND ART

Resource and energy consumption are major social issues. Especially for moving mechanical systems, high friction not only leads to energy consumption, but also affects highly reliable and long-life operation of equipment. As a high-performance solid lubricating film, a diamond-like carbon film has a frictional coefficient in the order of 0.05-0.1. The frictional coefficient has been greatly reduced compared with traditional films such as titanium nitride. However, for future systems such as deep-sea stations, space stations, and the vacuum system, the operational life of their mechanical systems has become the key to restricting their long-term service.

Super-lubrication specifically refers to a friction state in which the frictional coefficient is 0.001 or lower. Super-lubrication technology is considered to be a disruptive technology in the $21^{st}$ century, and its engineering application is expected to solve the full-cycle service problem of mechanical motion systems such as aerospace, vacuum, and deep-sea stations. The super-lubrication of diamond-like carbon films is mainly concentrated in vacuum. For example, the American Argonne Laboratory has developed a high-hydrogen-containing carbon film (containing 40% hydrogen) (Applied Physics Letters 2001, 78(17): 2449-2451). However, it can only achieve super-lubrication under vacuum conditions, which is difficult to use in engineering applications. Therefore, how to achieve engineering super-lubrication is still a technical problem.

SUMMARY

It is an object of the present disclosure to provide a method for realizing macroscopic engineering super-lubrication by a matching pair of nano metal-coated steel balls and hydrogen-containing carbon films.

The method for realizing macroscopic engineering super-lubrication in the present disclosure is based on the use of a matching pair of nano metal-coated steel balls and diamond-like films with a hydrogen content of 24-30%. A tribochemical reaction occurs through the catalytic action of nano metal during the friction process, and a nano graphene transfer film with incommensurate contact is formed at the contact interface to achieve macroscopic super-lubrication.

The substrate of the nano metal-coated steel ball is GCr15 bearing steel or steel ball of 440c stainless steel. The nano metal coating is a nano gold coating, a nano platinum coating, or a nano cobalt coating. Nano metal coating can be deposited on the surface of the steel ball by electroplating. The thickness of the nano metal coating is 600 to 800 nm.

The diamond-like film with a hydrogen content of 24-30% is prepared by depositing on the surface of the substrate by a plasma chemical vapor deposition method or a reactive magnetron sputtering method. The thickness of the diamond-like film is 700 to 1000 nm.

The nano metal coating and diamond-like film obtained above are subjected to experiments using a CSM friction machine to test their tribological performance: The friction atmosphere is argon, the humidity is controlled to be about 5%, the frequency is selected to be 5 Hz, the friction time is controlled to be 30 minutes, and the experiments are carried out under a loading of 1 N, 3 N, 5 N, 7 N, and 10 N, respectively. The results show that the ball frictional coefficient is the lowest when the nano metal coating is at 3 N, which is 0.0019 (see FIG. 2), and which achieves super-lubrication in argon atmosphere.

FIG. 3 is a high-resolution electron microscopy photograph of the friction interface of the nano metal-coated steel ball and the diamond-like film as the friction dual surface in the friction process of the present disclosure. It can be seen that the amorphous carbon film transforms into a more orderly multilayer graphene structure during the friction process between the nano metal-coated steel ball and the diamond-like film with a hydrogen content of 24-30% as the friction dual surface. Due to the catalytic effect of nano metal, a nano-graphene transfer film is formed at the friction interface, and the incommensurate contact of nano-graphene is the fundamental reason to realize the super-lubrication at the interface.

DETAILED DESCRIPTION OF THE EMBODIMENTS

Example 1

Figure 1:
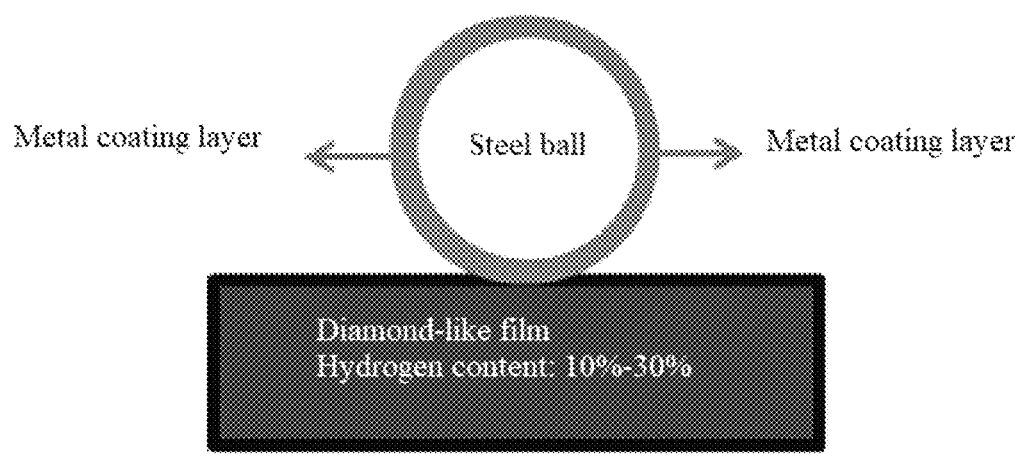
FIG. 1 is a schematic diagram of the macroscopic engineering super-lubrication realized by the present disclosure.
Figure 2:
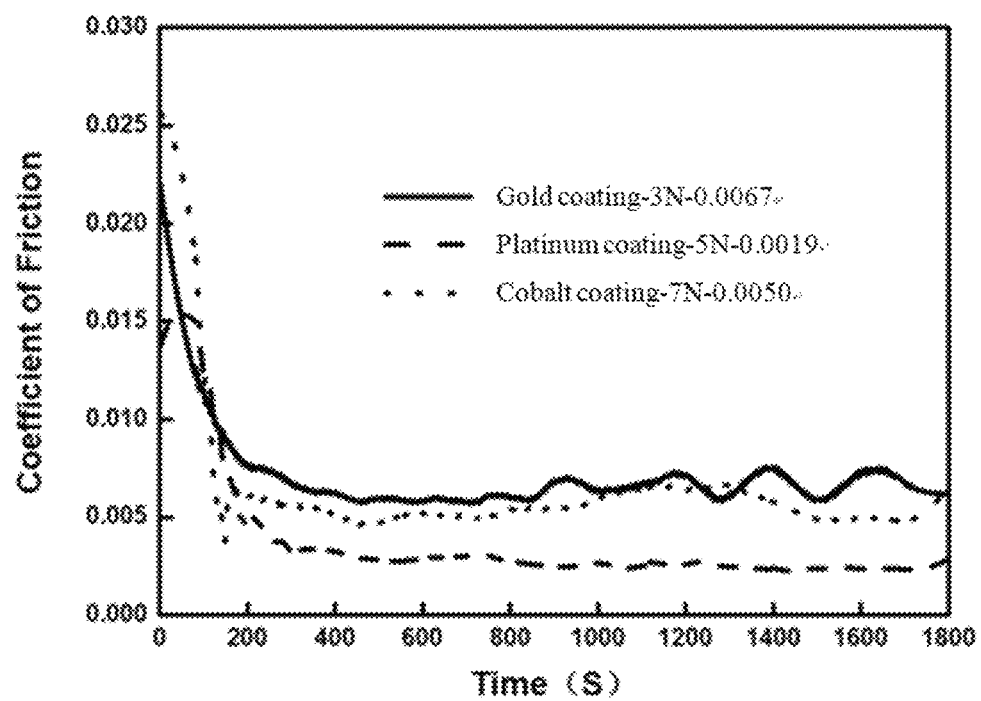
FIG. 2 is a graph of the optimal frictional coefficients of different metal-coated balls of the present disclosure.
Figure 3:
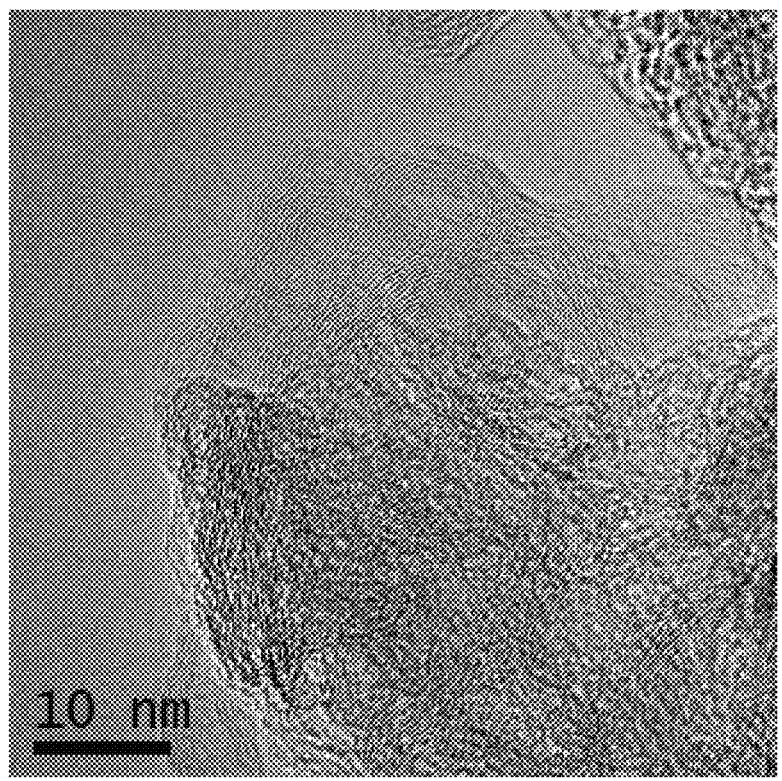
FIG. 3 is a high-resolution electron microscopy photograph of the friction interface of the present disclosure.

(1) GCr15 bearing steel (diameter 6 mm) is sonicated with tetrachloromethane and absolute ethanol for 30 minutes to remove dirt and impurities on the surface of the steel ball; after cleaning, the steel ball is checked to have been cleaned up and is ready for coating;

(2) Steel balls are coated by an electroplating method of displacement reaction: 0.6 g ammonium chloride and 0.6 g sodium sulfite are weighed; then 30 ml water and 10 ml chloroauric acid solution with a concentration of 4 g/L are added to prepare a needed coating solution; the steel balls to be coated are added to the solution with the pH of the reaction being adjusted to be 13; the chemical coating is carried out in a glass container at a temperature maintained to be 60° C. for a reaction time controlled to be 40 minutes to obtain gold-coated steel balls with a film thickness of 600 nm;

(3) A diamond-like film with a hydrogen content of 24% is prepared by a plasma vapor deposition method, and the film thickness is 1000 nm;

(4) The gold-coated balls and diamond-like film obtained above are subjected to experiments using a CSM friction machine to test their tribological performance: The friction atmosphere is argon, the humidity is controlled to be about 5%, the frequency is selected to be 5 Hz, the friction time is controlled to be 30 minutes, and the experiments are carried out under a loading of 1 N, 3 N, 5 N, 7 N, and 10 N, respectively. The results show that the ball frictional coefficient is the lowest when the gold coating is at 3 N, which is 0.0067 (see FIG. 2).

Example 2

(1) 440c stainless steel balls (diameter 5 mm) are sonicated with tetrachloromethane and absolute ethanol for 30 minutes to remove dirt and impurities on the surface of the steel ball; after cleaning, the steel ball is checked to have been cleaned up and is ready for coating;

(2) Steel balls are coated by an electroplating method of displacement reaction: 0.6 g EDTA and 0.6 g ammonium chloride are weighed; then 30 ml water and 10 ml potassium chloroplatinate solution with a concentration of 4 g/L are added to prepare a needed coating solution; after the pH of the reaction is adjusted to be 13, the steel balls to be coated are added to the solution; the chemical coating is carried out in a glass container at a temperature maintained to be 60° C. for a reaction time controlled to be 40 minutes to obtain platinum-coated steel balls with a film thickness of 800 nm;

(3) A diamond-like film with a hydrogen content of 30% is prepared by a plasma vapor deposition method, and the film thickness is 800 nm;

(4) The platinum-coated balls and diamond-like film obtained above are subjected to experiments using a CSM friction machine to test their tribological performance: The friction atmosphere is argon, the humidity is controlled to be about 5%, the frequency is selected to be 5 Hz, the friction time is controlled to be 30 minutes, and the experiments are carried out under a loading of 1 N, 3 N, 5 N, 7 N, and 10 N, respectively. The results show that the ball frictional coefficient is the lowest when the platinum coating is at 5 N, which is 0.0019 (see FIG. 2).

Example 3

(1) 440c stainless steel balls (diameter 10 mm) are sonicated with tetrachloromethane and absolute ethanol for 30 minutes to remove dirt and impurities on the surface of the steel ball; after cleaning, the steel ball is checked to have been cleaned up and is ready for coating;

(2) Steel balls are coated by an electroplating method of displacement reaction: 0.8 g cobalt chloride and 2 g potassium sodium tartrate are weighed; then 30 ml water is added to prepare a needed coating solution; after the pH of the reaction is adjusted to be 13, the steel balls to be coated are added to the solution; the chemical coating is carried out in a glass container at a temperature maintained to be 60° C. for a reaction time controlled to be 40 minutes to obtain cobalt-coated steel balls with a film thickness of 800 nm;

(3) A diamond-like film with a hydrogen content of 27% is prepared by a plasma vapor deposition method, and the film thickness is 800 nm;

(4) The cobalt-coated balls and diamond-like film obtained above are subjected to experiments using a CSM friction machine to test their tribological performance: The friction atmosphere is argon, the humidity is controlled to be about 5%, the frequency is selected to be 5 Hz, the friction time is controlled to be 30 minutes, and the experiments are carried out under a loading of 1 N, 3 N, 5 N, 7 N, and 10 N, respectively. The results show that the ball frictional coefficient is the lowest when the cobalt coating is at 7 N, which is 0.005 (see FIG. 2).

What is claimed is:

1. A method for realizing macroscopic super-lubrication by a matching pair of nano metal-coated steel balls and hydrogen-containing carbon films, wherein nano metal-coated steel balls and diamond-like films with a hydrogen content of 24-30% are used as the matching pair, and a tribochemical reaction occurs through the catalytic action of nano metal during the friction process to form a nano graphene transfer film at the contact interface to achieve macroscopic super-lubrication.

2. The method for realizing macroscopic super-lubrication by a matching pair of nano metal-coated steel balls and hydrogen-containing carbon films according to claim 1, wherein the substrate of the nano metal-coated steel ball is GCr15 bearing steel or steel ball of 440c stainless steel.

3. The method for realizing macroscopic super-lubrication by a matching pair of nano metal-coated steel balls and hydrogen-containing carbon films according to claim 1, wherein the nano metal coating of the nano metal-coated steel ball is a nano gold coating, a nano platinum coating, or a nano cobalt coating, and the thickness of the nano metal coating is 600 to 800 nm.

4. The method for realizing macroscopic super-lubrication by a matching pair of nano metal-coated steel balls and hydrogen-containing carbon films according to claim 1, wherein the nano metal coating forms a nano metal film on the surface of the steel ball by electroplating.

5. The method for realizing macroscopic super-lubrication by a matching pair of nano metal-coated steel balls and hydrogen-containing carbon films according to claim 1, wherein the diamond-like film with a hydrogen content of 24-30% is prepared by depositing on the surface of the substrate by a plasma chemical vapor deposition method or a reactive magnetron sputtering method.

6. The method for realizing macroscopic super-lubrication by a matching pair of nano metal-coated steel balls and hydrogen-containing carbon films according to claim 1, wherein the thickness of the diamond-like film is 700 to 1000 nm.

* * * * *